United States Patent [19]
Zhou et al.

[11] Patent Number: 5,953,479
[45] Date of Patent: Sep. 14, 1999

[54] TILTED VALANCE-BAND QUANTUM WELL DOUBLE HETEROSTRUCTURES FOR SINGLE STEP ACTIVE AND PASSIVE OPTICAL WAVEGUIDE DEVICE MONOLITHIC INTEGRATION

[75] Inventors: Weimin Zhou, Rockville, Md.; Paul W. Cooke, Hazlet, N.J.

[73] Assignee: The United States of America as represented by the Secretary of the Army, Washington, D.C.

[21] Appl. No.: 09/074,220

[22] Filed: May 7, 1998

[51] Int. Cl.$^6$ ................................. G02B 6/10; H01S 3/19
[52] U.S. Cl. ............................. 385/131; 372/45; 372/50; 385/14
[58] Field of Search .................................... 385/131, 132, 385/14; 372/43–50; 257/14, 17, 18, 22

[56] References Cited

U.S. PATENT DOCUMENTS

| 5,732,179 | 3/1998 | Caneau et al. | 385/131 |
| 5,754,714 | 5/1998 | Suzuki et al. | 385/131 |
| 5,848,085 | 12/1998 | Nitta | 372/45 |
| 5,862,168 | 1/1999 | Schilling et al. | 372/50 |

OTHER PUBLICATIONS

T.H. Wood, "Multiple Quantum Well Waveguide Modulators", Journal of Lightwave Technology, vol. 6, pp. 743–757, Jun. 1988.

D.A.B. Miller, "Electric Field Dependence of Optical Absorption Near the Bnad Gap of Quantum–Well Structures", Physical Review B, vol. 32, pp. 1043–1060, Jul. 1985.

D.A.B. Miller et al, "Band–Edge Electroabsorption in Quantum Well Structures: The Quantum Confined Stark Effect", 53 Physics Review Letters 2173 (1984).

*Primary Examiner*—Hemang Sanghavi
*Attorney, Agent, or Firm*—Michael Zelenka; George B. Tereschuk

[57] ABSTRACT

Opto-electronic integrated waveguide devices are provided using a tilted valence band quantum well semiconductor double heterostructure with one growth of the same waveguide material, that operate simply by their normal operating forward bias for active waveguides with optical gain and operating in a reverse or no bias for active waveguide without optical gain or passive waveguides. The optical waveguides comprise a substrate, a bottom cladding layer, a core layer having a quantum well optical waveguiding double heterostructure and a top cladding layer. The quantum well optical waveguiding double heterostructure includes an InGaPAs first barrier layer atop the bottom cladding layer, a quantum well layer constructed of $InxGa1_{x-y}Al_yAs$ is stacked on top of the first barrier layer which is graded from one side to the other forming a linearly increasing quantum well energy bandgap and an $In_{.52}AlGaAs$ second barrier layer is stacked on top of said quantum well core layer. The quantum well layer provides a first conduction band offset ratio at a first interface point smaller than a second conduction band offset ratio at a second interface point, as well as a valence band being tilted, with the first barrier layer energy bandgap being greater than the quantum well energy bandgap, and the quantum well energy bandgap being lesser than said second barrier layer energy bandgap. The first barrier layer, quantum well layer and second barrier layer can be coextensive with one another.

20 Claims, 3 Drawing Sheets

V>0 FORWARD BIAS

V=0

V<0 REVERSE BIAS

TILTED VALANCE-BAND QUANTUM WELL DOUBLE HETEROSTRUCTURES FOR SINGLE STEP ACTIVE AND PASSIVE OPTICAL WAVEGUIDE DEVICE MONOLITHIC INTEGRATION

GOVERNMENT INTEREST

The invention described herein may be manufactured, used, and licensed by or for the Government for governmental purposes without the payment to us of any royalty thereon.

FIELD OF THE INVENTION

This invention relates in general to semiconductor optoelectronic waveguide materials, devices and integrated structures, and more particularly to Opto-Electronic Integrated Circuits using a single semiconductor heterostructure with a single growth.

BACKGROUND OF THE INVENTION

Numerous applications exist for Opto-Electronic Integrated Circuits (OEIC's) that can utilize a single semiconductor structure, including monolithically integrated waveguide lasers, amplifiers, modulators, splitters, phase shifters and so on.

Quantum well structures are used in optical waveguides and have also been disclosed in a number of publications, including one by T. H. Wood entitled "Multiple Quantum Well Waveguide Modulators", Journal of Lightwave Technology, vol. 6, pp. 743–757, June 1988.

However there are a number of problems, disadvantages and shortcomings with the integration of current optical waveguide structures due to different bandgap requirements for different devices. Among the shortcomings in this area are problems caused by epitaxial regrowth, the difficulties of wafer to wafer interconnection and problems associated with selective growth. Until now, prior art waveguides and similar related structures have by necessity been provided on two or more physically discrete semiconductor material structures. This requires taking the semiconductor materials on and off of the crystal growth chamber several times and also necessitates the costly and time consuming process of then matching these semiconductor materials with one another and then attaching them to each other. The devices of the present invention solve those optical waveguide structures problems, disadvantages and shortcomings by advantageously tilting a valence band quantum well double heterostructure.

The devices of the present invention provide novel optoelectronic integrated circuits having a unique tilted valence band quantum well heterostructure. This permits the manufacturer to employ a semiconductor heterostructure with only one growth that avoids the long-standing difficulties of epitaxial regrowth and wafer to wafer interconnection as well as the numerous problems associated with selective growth.

Active semiconductor waveguides are those with gain. It is well known that active and passive semiconductor waveguides operating in the same wavelength have different energy bandgaps. The devices of the present invention provide a novel material structure based on tilting the quantum well in an advantageous manner that provides both the active and passive waveguide sections on the same waveguide material. These devices function simply by their normal operating in a forward voltage bias for active waveguides such as lasers and amplifiers and operating in a reverse voltage bias or 0 bias for modulators or passive waveguides. The present invention uses the same physical structure for either bias orientation but applying a reverse bias allows it to function as a different device, i.e. an amplifier can function only as an amplifier when forward bias is applied. By allowing operating both in the forward and reverse directions on the same material, the tilted quantum well heterostructure devices of the present invention eliminate complex and expensive fabrication processes such as regrowth and interconnection. Moreover, such a tilted quantum well double heterostructural arrangement can markedly improve the quality and efficiency of the device, making it ideal for OEIC's.

Using both the graded composition and different conduction band offset ratios between the quantum well and barrier interfaces causes a large electrical field for the heavy hole valence band in the quantum well, which is the opposite of the well-known p-i-n field of standard waveguide device structures. The advantage of this invention's new arrangement is that the absorption edge, or transition energy, of the waveguide structure can now be widely tuned to lower energy with a forward bias, and then tuned to higher energy with a reverse bias, due to the quantum confined Stark effect described in D. A. B. Miller's "Electric Field Dependence of Optical Absorption Near the Band Gap of Quantum-Well Structures," Physical Review B, vol. 32, pp. 1043–60, July 1985. Based on the advantages of the present invention, both active and passive waveguide devices can now be fabricated on the same structure by applying their normal operating biases. This can be done without the cumbersome, complex and costly additional fabrication procedures previously required for fabricating such waveguides with two or more physically discrete semiconductor material structures.

Another prior art publication considered relevant in addition to T. H. Wood's "Multiple Quantum Well Waveguide Modulators" and D. A. B. Miller's et al., "Electric Field Dependence of Optical Absorption Near the Band Gap of Quantum-Well Structures", cited above, is D. A. B. Miller et al., "Band-Edge Electroabsorption in Quantum Well Structures: The Quantum-Confined Stark Effect," 53 Physics Review Letters 2173 (1989).

SUMMARY OF THE INVENTION

Accordingly, it is an object of the present invention to provide improved opto-electronic integrated circuits.

It is an additional object of the present invention to provide opto-electronic integrated circuit devices utilizing a tilted quantum well semiconductor heterostructure with one growth.

It is a further object of the present invention to provide opto-electronic integrated circuit devices utilizing a tilted quantum well semiconductor double heterostructure with one growth on the same waveguide material. Such devices are operated rather simply with the standard operating forward voltage bias for active waveguides with optical gain and also, on the same p-i-n structure, operating in a reverse or no bias for other active devices and passive waveguides.

BRIEF DESCRIPTION OF THE DRAWINGS

These and other objects, features, advantages and details of the present invention will become apparent in light of the ensuing detailed disclosure, and particularly in light of the drawings wherein.

The term "quantum well structure" as used throughout this specification should be considered to be an artificial layered semiconductor crystal structure. In this structure the electron, or hole, potential energy forms an energy well in the direction perpendicular to the layer plan and discrete quantized electron states are formed in the well region, along with any other conventional and accepted definitions of that term.

The term "heterostructure" as used throughout this specification should be considered to be an artificial layered crystal structure formed by layers having different material compositions, along with any other conventional and accepted definitions of that term.

The term "quantum confined Stark effect" or "QCSE", as used throughout this specification should be considered to be a perturbation on a quantum confined electron energy state due to the presence of an electric field, along with any other conventional and accepted definitions of that term.

The term "first heavy-hole subband" or "HH", as used throughout this specification should be considered to be the first heavy hole energy level in the quantum well due to the well confinement, along with any other conventional and accepted definitions of that term.

DETAILED DESCRIPTION OF THE DRAWINGS

Those concerned with the limitations, shortcomings and expense of fabricating optical waveguide semiconductor materials by conventional techniques that require use of discrete semiconductor material structures, along with the necessary regrowth and interconnection have long recognized the need for a simpler and more inexpensive fabrication technique. The present invention provides optoelectronic integrated waveguide devices utilizing a tilted valence band quantum well semiconductor double heterostructure with one growth of the same waveguide material. The devices of the present invention are operated rather simply by their normal operating forward bias for active waveguides with optical gain and operating in a reverse or no bias for active waveguide without optical gain or passive waveguides. These devices offer the advantages of being less cumbersome, complex and inexpensive, and operating with much improved quality, without suffering from any of the disadvantages, shortcomings and limitations of prior art structures.

Figure 1:
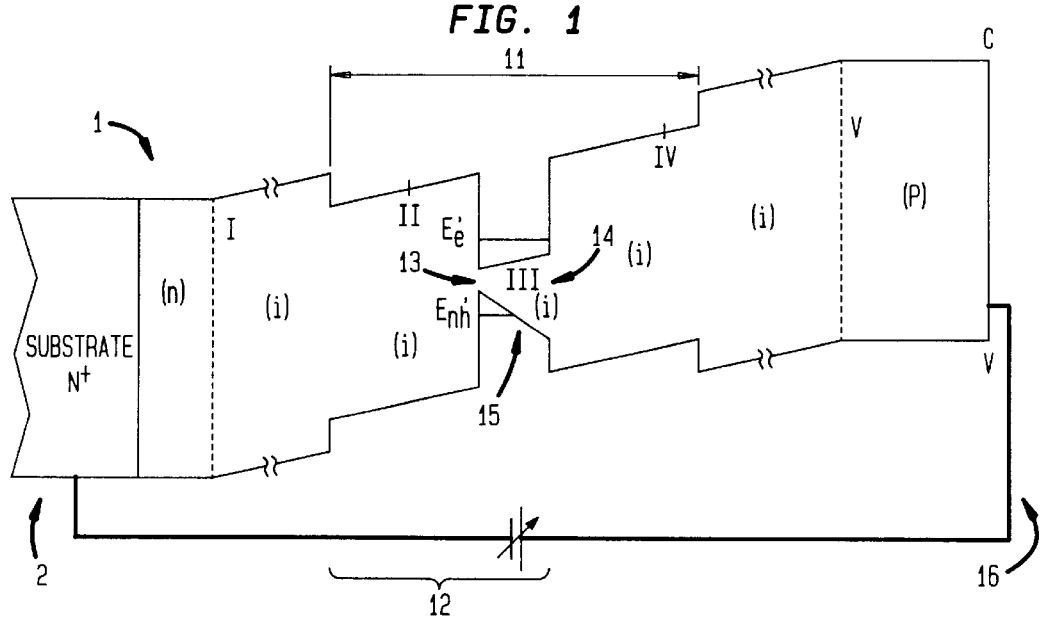
FIG. 1 is a horizontal diagram of the conventional energy bands for p-i-n and the cladding-core-cladding layered tilted quantum well structure utilized in all embodiments of the present invention.

FIG. 1 is a diagram of the energy bands for p-i-n and cladding-core-cladding layered structure, utilized in all embodiments of the present invention. The Opto-Electronic Integrated circuit 1 of the present invention comprises a series of layers depicted horizontally in FIG. 1 from left-to-right, with the left representing the bottom and the right representing the top of the structure, advantageously arranged on the same waveguide materials. The p-i-n built-in electrical field refers to the layering of the p-type, i-type and n-type semiconductive material well known to those in the semiconductor electronics arts. Referring now to FIG. 1, the Opto-Electronic Integrated circuit 1 of the present invention comprises a substrate 2, a bottom cladding layer I, an intrinsic core region 11 and a top cladding layer V. Said bottom cladding layer I is disposed on said substrate 2 and under said intrinsic core region 11. Said top cladding layer V is disposed on top of said intrinsic core region 11. The intrinsic core region 11 defines a core layer having a quantum well double heterostructure 12.

Said quantum well double heterostructure 12, further comprises a barrier layer II, a quantum well layer III and a barrier layer IV, with said quantum well layer III having a tilted valence band 15. While FIG. 1 only diagrams a single tilted heterostructure, multiple heterostructures may be advantageously employed and are also within the contemplation of this invention. Also depicted are a conduction band C and a valence band V. A connecting circuit 16 is coupled to the top surface of said circuit 1 and to said substrate 2.

The energy bandgap of the three layers of said quantum well double heterostructure 12 is based on the following relationship: $E_g^{II} > E_g^{III} < E_g^{IV}$. Said quantum well layer III is constructed of materials graded from a first side near a layer II/III interface 13 to a second side near a layer III/IV interface 14, thereby linearly increasing the bandgap value in said tilted valence band 15. Said quantum well layer III having a well width range from 80 to 200 Å. Within said tilted valence band 15, said layer II/III interface 13 is in close proximity to said layer III/IV interface 14. Said tilted valence band 15 is depicted in FIG. 1 as being on an angle in order to represent tilting. Said quantum well layer III having a lattice constant relatively close to that of said substrate 2 with either no significant strain buildup or with a small strain. The barrier layer II, quantum well layer III and barrier layer IV may be coextensive with one another.

The layer II/III interface 13 has a conduction-bandgap offset ratio, Qc, which is much smaller than the conduction-bandgap offset ratio for the layer III/IV interface 14 so that $Qc^{II-III} < Qc^{III-IV}$. These characteristics result in said tilted valence band 15 being tilted within said quantum well layer III providing a large, built-in electrical field due to both the graded energy gap and the difference in the conduction band offset ratios on both sides of said quantum well layer III. The ground state transition energy of said quantum well layer III is generated from the first electron subband to the first heavy-hole ("HH") subband, making it larger than the operating light energy, $E_\lambda^{op}$, without external bias or with a small reverse bias so that $Eg > E_\lambda^{op}$. However, the bandgap is also slightly smaller with a forward bias so that $Eg < E_\lambda^{op}$. Said barrier layers II and IV can each have a thickness ranging between 150 to 1,000 Å.

One of the advantages of the present invention is that by disposing the quantum well double heterostructure 12 within said bottom and top cladding layers I and V, respectively, and having said bottom cladding layer I under said quantum well double heterostructure 12 with said top cladding layer V being on top of said quantum well double heterostructure 12, the present invention's I and V layers provide a lower refractive index than the effective index of said layers II–III–IV of the quantum well double heterostructure 12. All epitaxially grown layers, I–V, respectively, are nominally lattice matched to the substrate 2. Said bottom and top cladding layers I and V, respectively, are partially n and p-typed doped, in order to form the p-i-n structure.

Figure 2:
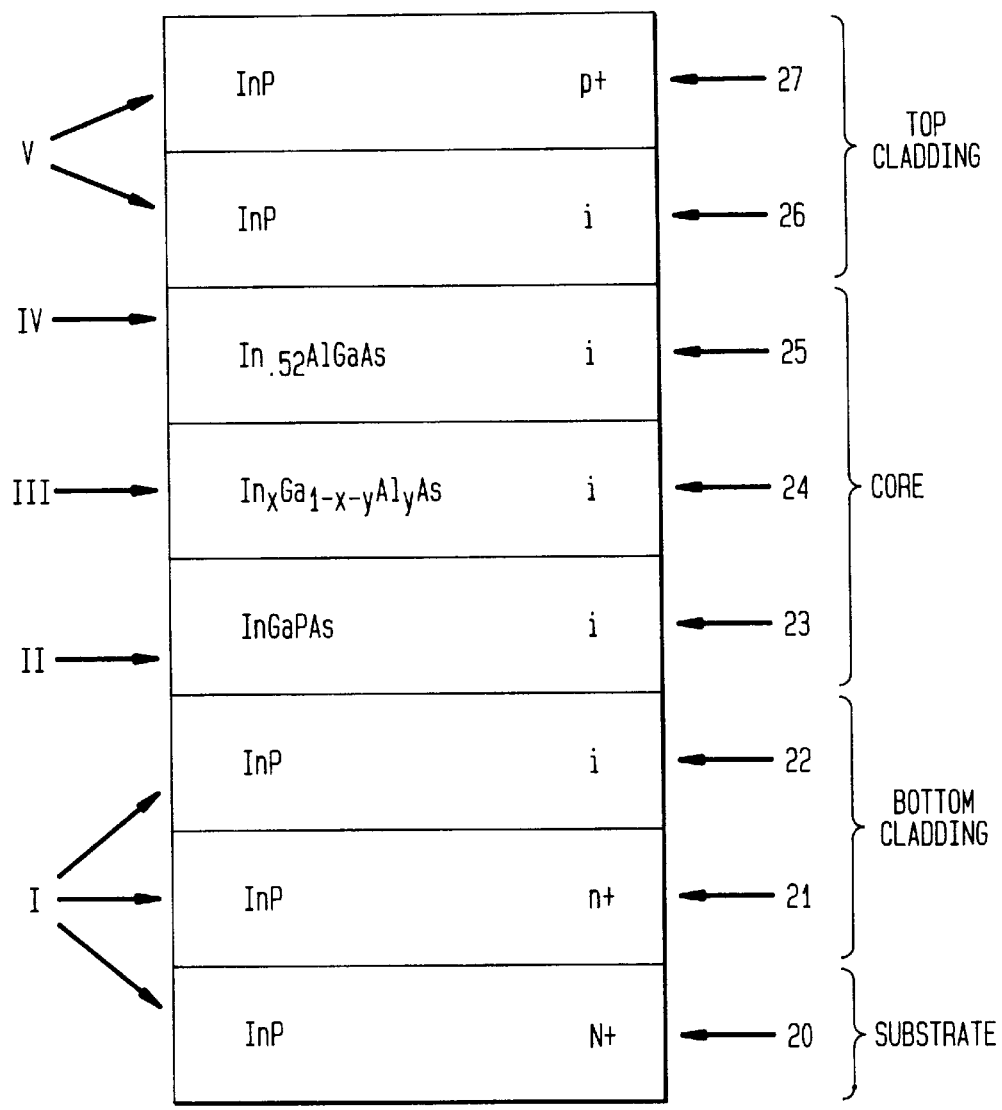
FIG. 2 is a cross-sectional vertical layer structure diagram of a 1.55 μm operation wavelength semiconductor tilted quantum well double heterostructure which is the preferred embodiment of the present invention.

FIG. 2 is a cross-sectional vertical layer structure diagram of a 1.55 μm optical waveguide heterostructure which is the preferred embodiment of the present invention. In FIG. 2, a FIG. 1 type heterostructure with specific chemical layers is shown vertically, starting from the bottom to the top, as a series of layers in an imaginary cross-sectional view, utilizing Roman numerals for different portions of the structure. A bottom cladding layer I is formed by combining an Indium-phosphate, InP, $N^+$ substrate 20, an epitaxially grown n-type doped InP layer 21 and an intrinsic, or i, InP layer. The thickness of said bottom cladding layer I ranges between 1–2 $\mu$m. Barrier layer II is a lattice matched undoped InGaPAs layer 23 having an energy gap of 1 to 1.3 eV. Quantum well layer III, starting from the II/III interface, is a layer of $In_xGa_{1-x-y}Al_yAs$ 24, where x remains centered at about 53%, and can vary in a range of between 40% to 70% of mole fraction. Subscript y linearly increases from 0 to $y_1$, with $y_1$ ranging from 7% to 20% of mole fraction, within said quantum layer III, having a well width range of between 80 to 200 Å. A barrier layer IV, starting at the III/IV interface, is barrier 25 composed of $In_{.52}AlGaAs$, or InGaPAs lattice matched to InP with a bandgap energy of 1 to 1.3 eV. A top cladding layer V, which starts from the IV/V interface, is an InP i-type undoped layer 26 that follows a doped $p^+$-type InP layer 27. Said top cladding layer V can have a thickness of between 1–2 $\mu$m and said quantum well layer III can have a thickness ranging between 0.2 to 1 $\mu$m.

A number of variations of the preferred embodiment depicted in FIG. 2 are encompassed within the present invention. Other suitable wavelengths beside the 1.55 $\mu$m operation wavelength disclosed herein, including a 1.3 $\mu$m wavelength, are also within the contemplation of the present invention and should operate quite satisfactorily. In the bottom cladding layer I, instead of combining said InP substrate 20 with said epitaxially grown doped n-type InP layer 21, said bottom cladding layer I may also comprise said InP substrate 20 and an n-type and undoped lattice matched $In_{.52}AlAs$ layer. Other variations of said bottom cladding layer include combining said $n^+$-type doped InP layer with an undoped lattice matched InP layer, as well as combining said InP substrate 20 and an i-type undoped lattice matched $In_{.52}AlAs$ layer. Similarly, said top cladding layer V may also comprise either a $p^+$-type $In_{.52}Al_{.48}As$ layer or an undoped i-type $In_{.52}Al_{.48}As$ layer 27. Also, layers II, III and IV may be repeated to make multiple quantum wells, however in such a case, the overall i region needs to be relatively short so that the p-i-n built-in electrical field can compensate about ⅔ of the tilted valence band built-in field. Significantly, the present invention's structures permit fabricating said barrier layer II, said quantum well layer III and said barrier layer IV from a single piece of waveguide core material, as well as repeating those layers on a single piece of waveguide core material.

Figure 3:
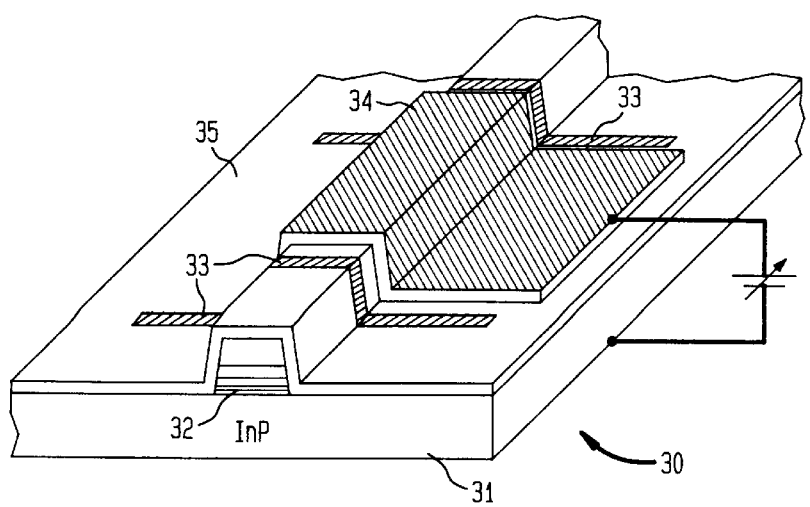
FIG. 3 is a perspective view of a rib type optical waveguide including the tilted quantum well double heterostructure of the present invention.

In operation, the FIG. 2 optical waveguide heterostructure can be incorporated within a semiconductor device such as the rib type optical waveguide depicted in FIG. 3. The FIG. 3 device can be manufactured by conventional semiconductor fabrication techniques including photolithography, dry and wet etching techniques for the mesa of the literal waveguide, and using ion implantation for lateral electrical isolation and a dielectric layer for vertical electrical isolation and metal layer deposition for contacts.

Referring now to FIG. 3, a rib type optical waveguide 30 comprises an InP substrate 31, a quantum well double heterostructure 32, an $H^+$ implant, or other electrical isolation, 33, a metal layer 34 and a dielectric layer 35. Said rib type optical waveguide 30 can operate as either an active optical amplifier, or as a passive modulator, phase-shifter, or transparent waveguide for the same operating wavelength, such as 1.55 $\mu$m, by applying different biases. The transition energy from the first HH subband to the first electron subband can be shifted by the net field, which is the built-in field found in the quantum well double heterostructure 32, the p-i-n built-in field and the external applied field, due to the quantum confined Stark effect ("QCSE"). This transition energy is proportional to the effective mass of the electron hole. Since the HH mass is much larger than the electron mass, the quantum confined Stark shift is dominated by the change in field of the HH band.

Figure 4A:
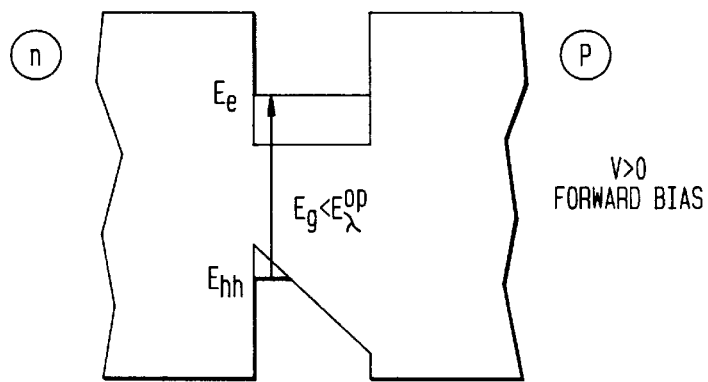
FIGS. 4A–C are diagrams of the band structure for forward bias, no external bias and reverse bias.
Figure 4B:
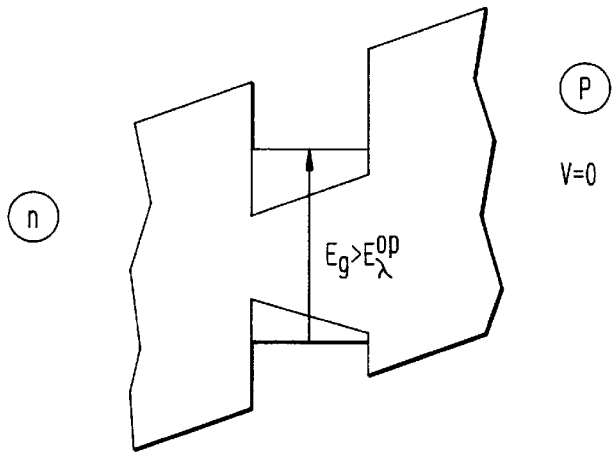
Figure 4C:
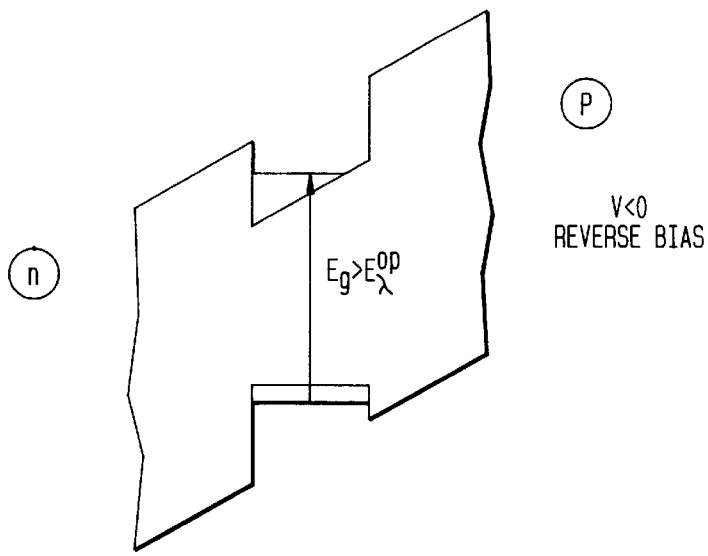

Referring now to FIG. 4, in which three diagrams depict the band structure in a quantum well double heterostructure for forward bias in FIG. 4A, no external bias in FIG. 4B and reverse bias in FIG. 4C. In FIG. 4A, which depicts band structure when a forward bias is applied, in the I region, the valence band in the quantum well double heterostructure 12 of FIG. 1 has the largest field, which causes a transition energy red shift due to the QCSE. The bandgap, indicated by an arrow, is reduced and becomes smaller than the operating light energy. The injected current from the forward bias can then create optical gain, which means that the device can be operated as an optical amplifier or laser. This condition is represented by the equation $Eg<E_\lambda^{op}$.

FIG. 4B depicts band structure when no external bias is applied. The built-in electrical field induced by the p-i-n structure of the FIG. 1 structure may compensate a significant portion of the built-in field of the tilted valence band of the quantum well layer. As a result, there is a blue shift due to the QCSE reduction rather than the FIG. 4A red shift. The bandgap, indicated by an arrow, becomes larger than the light energy, which reduces absorption loss, making the waveguide "transparent." This condition is represented by the equation $Eg>E_\lambda^{op}$.

FIG. 4C depicts band structure when reverse bias is applied. When a reverse bias is applied, the bandgap, indicated by an arrow, within the FIG. 1 structure changes the absorption edges due to QCSE which can also change the waveguide's effective refractive index. In this condition, the waveguide is capable of operating as a phase shifter or modulator device.

As those skilled in the art will appreciate from this, the devices fabricated in accordance with this specification and figures can then be used in applications of an optically controlled microwave system, interferrometric fiber optic gyroscope, optical signal processor and the like.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What we claim is:

1. A optical waveguide, comprising:
   a substrate;
   a bottom cladding layer disposed on said substrate;
   a core layer having a quantum well optical waveguiding double heterostructure;
   a top cladding layer;
   said quantum well optical waveguiding double heterostructure further comprising:
   a first barrier layer constructed of InGaPAs being atop said bottom cladding layer;
   a quantum well layer, constructed of $In_xGa_{1-x-y}Al_yAs$, where x is centered at about 53% of mole fraction, having a variation of between 40% to 70% of mole fraction, y linearly increases from 0 to $y_1$, where $y_1$ ranges between 7% to 20% of mole fraction, said quantum well layer having a band gap energy of 0.79 to 1 eV and being stacked on top of said first barrier layer;

a second barrier layer, constructed of $IN_{.52}AlGaAs$, stacked on top of said quantum well core layer, said second barrier layer being lattice matched to InP with a bandgap energy of 1.0 to 1.3 eV;

said $In_xGa_{1-x-y}Al_yAs$ of the quantum well layer, being graded from one side to the other forming a quantum well energy bandgap linearly increasing to a first interface point where said first barrier layer and said quantum well layer interface and to a second interface point where said quantum well layer and said second barrier layer interface;

a first conduction band offset ratio at said first interface being smaller than a second conduction band offset ratio at said second interface;

a valence band being tilted; and said first barrier layer energy bandgap being greater than said quantum well energy bandgap, said quantum well energy bandgap being lesser than said second barrier layer energy bandgap.

2. The optical waveguid, as recited in claim 1, wherein the said quantum well optical waveguiding double heterostructure further comprises said first barrier layer, said quantum well layer and said second barrier layer being coextensive with one another.

3. The optical waveguide, as recited in claim 2, wherein:

said first barrier has a thickness in a range between 150 to 1,000 Angstroms;

said quantum well layer has a well width thickness in a range between 80 to 200 Angstroms; and said second barrier layer has a thickness in a range between 150 to 1,000 Angstroms.

4. The optical waveguid, as recited in claim 3, wherein:

said first barrier layer is lattice matched, undoped and has a bandgap energy in a range between 1.0 to 1.3 eV; nad said second barrier layer is lattaice matched to InP with a bandgap energy in a range between 1.0 to 1.3 eV.

5. The optical waveguide, as recited in claim 4, wherein said first barrier layer, said quantum well layer and said second barrier layer are fabricated from a single piece of waveguide core material.

6. The optical waveguid, as recited in claim 5, further comprising said first barrier layer, said quantum well layer and said second barrier layer being repeated on said single piece of waveguide core material.

7. The optical waveguide, as recited in claim 6, further comprising p-i-n built-in electrical field region of the quantum well optical wavegudiding double heterostructure compensating at least ⅔ of a built-in field of said tilted valence band.

8. The optical waveguide, as recited in claim 7, wherein the quantum well optical waveguiding double heterostructure provides an operation wavelength of about 1.55 μm.

9. The optical waveguide, as recited in claim 7, wherein the quantam well optical waveguiding double heterostructure provides an operation wavelength of about 1.3 μm.

10. The optical waveguide, as recited in claim 7, wherein:

said quantam well optical waveguiding double heterostructure is sandwiched between said bottom cladding layer and said top cladding layer;

said quantum well optical waveguiding double heterostructure being stacked on said bottom cladding layer; and said top cladding layer being stacked on said quantam well optical waveguiding double heterostructure.

11. The optical waveguide, as recited in claim 10, further comprising the core layer having a thickness between 0.2–1 μm.

12. The optical waveguide, as recited in claim 10, wherein said second barrier layer is contructed of InGaPAs.

13. The optical waveguide, as recited in claim 10, said second barrier layer has a thickness wherein said substrate and said bottom and top cladding layers are composed of InP.

14. The optical waveguide, as recited in claim 13, wherein said bottom cladding layer is constructed by combining said substrate with an epitaxially grown n⁺-type doped InP layer.

15. The optical waveguide, as recited in claim 13, wherein said bottom cladding layer is constructed by combining said substrate with an n-type and undoped lattice matched $In_{.52}AlAs$ layer.

16. The optical waveguide, as recited in claim 14, wherein said bottom cladding layer is contructed by combining said n⁺-type doped InP layer with an undoped lattice matched InP layer.

17. The optical waveguide, as recited in claim 10, wherein said substrate is composed of an InP n type material.

18. The optical wavguide, as recited in claim 10, wherein said top cladding layer is contstructed by combining an undoped i-type InP layer with a doped p⁺-type InP layer.

19. The optical waveguide, as recited in claim 10, wherein said top cladding layer is constructing by combining an InP p⁺-type doped layer with a undoped i-type InP layer near a third interface between said second barrier layer and said top cladding layer.

20. The optical waveguide, as recited in claim 1, further comprising said InP top cladding layer of the quantam well optical waveguiding double heterostructure having a thickness between 1–2 μm.

* * * * *